United States Patent [19]

Clark

[11] Patent Number: 4,553,323

[45] Date of Patent: Nov. 19, 1985

[54] COMPONENT PLACEMENT HEAD CONTROL

[75] Inventor: William S. Clark, So. Hamilton, Mass.

[73] Assignee: USM Corporation, Farmington, Conn.

[21] Appl. No.: 563,260

[22] Filed: Dec. 19, 1983

[51] Int. Cl.⁴ .............................................. B23P 19/02
[52] U.S. Cl. ........................................ 29/741; 29/714; 29/739; 74/526
[58] Field of Search .......... 29/739, 740, 741, 714–719; 74/526

[56] References Cited

U.S. PATENT DOCUMENTS 3,545,064  12/1970  Zemek et al. .......................... 29/741
3,896,681  7/1975  Boyle ..................................... 74/526
3,951,005  4/1976  Dahlstrom ............................. 74/526

Primary Examiner—Howard N. Goldberg
Assistant Examiner—P. W. Echols
Attorney, Agent, or Firm—Alan N. McCartney

[57] ABSTRACT

An electrical component placement head control for automatically spacing the component inserter of the head from a printed circuit board comprising of a stop limiting downward movement of the head that coacts with a control shaft having an eccentric cam surface controlling the position of the stop.

9 Claims, 3 Drawing Figures

COMPONENT PLACEMENT HEAD CONTROL

BACKGROUND OF THE INVENTION

(1) Field of the Invention

An electrical component placement head control that controls the spacing between the component insertion mechanism of the head and the surface of the printed circuit board.

(2) Summary of the Prior Art

In the field of machines for automatically placing electronic components on printed circuit boards, the components are obtained from a supply source and transported to a placement head which inserts the component into the printed circuit board. Examples of these types of machines are illustrated in U.S. Pat. Nos. 2,896,213; 3,488,672; 3,550,238; 3,594,889; 4,063,347; 4,293,999 and 4,403,390.

In this type of machine it is desirable to automatically adjust the spacing between the component insertion mechanism of the head and the surface of the printed circuit board to accommodate different types of components that are inserted during the assembly operation.

SUMMARY OF THE INVENTION

A placement head control for controlling the distance between the component insertion mechanism of the head and the printed circuit board into which electronic components are inserted.

A further object of the invention is to mount a rotary shaft in the frame of a component placement machine; the shaft having an eccentric cam surface controlling the position of a depth stop which limits the throw of a placement head to permit adjustment of the head spacing from a printed circuit board to facilitate insertion of different diameter components into the board. The rotation of the shaft is controlled by a servo motor connected to the computer control of the operation of the automatic component insertion machine.

DESCRIPTION OF THE PREFERRED EMBODIMENT

Figure 1:
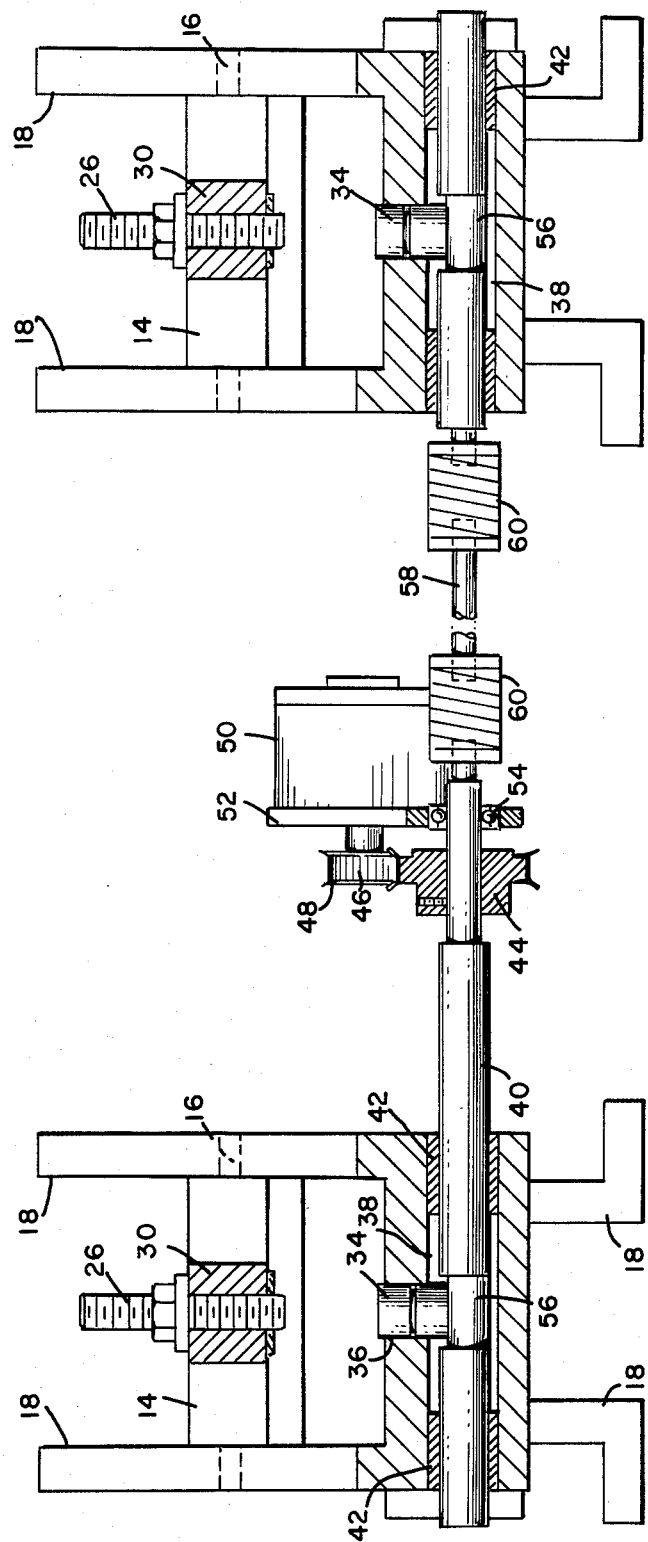
FIG. 1 is a front elevational view of the placement head control of this invention.

Machines for automatically placing electronic components on a printed circuit board have a placement head for inserting the component into the board. U.S. Pat. No. 3,550,238 illustrates such a machine and it is in the environment of such automatic component assembly machines that the placement head control of this invention is utilized.

The placement head actuator 10 comprises a vertical shaft 12 (see FIGS. 2 and 3) mounted on the machine frame (not shown) in some convenient fashion for up and down movement. The shaft 12 is linked to a placement mechanism for inserting an electrical component into a printed circuit board. An illustration of such a placement mechanism and how the component is inserted into a printed circuit board is disclosed in commonly owned U.S. Pat. No. 3,550,238 and the disclosure therein is incorporated by reference. Further, in some types of component assembly machines, there are side-by-side placement heads to provide a dual headed machine to increase component assembly capability. It is in this latter type of machine that this invention is disclosed.

The head actuator 10 comprises a drive lever 14 pivotably mounted at 16 to the support 18 on the machine frame. The other end 20 of drive lever 14 is pivotally connected at 22 to the end 24 of the shaft 12. The movement of drive lever 14 will drive the shaft 12 up and down during the component placement sequence of the operation of the machine. The opposite end 12' of the shaft 12 would carry the insertion mechanism. (not shown).

Figure 2:
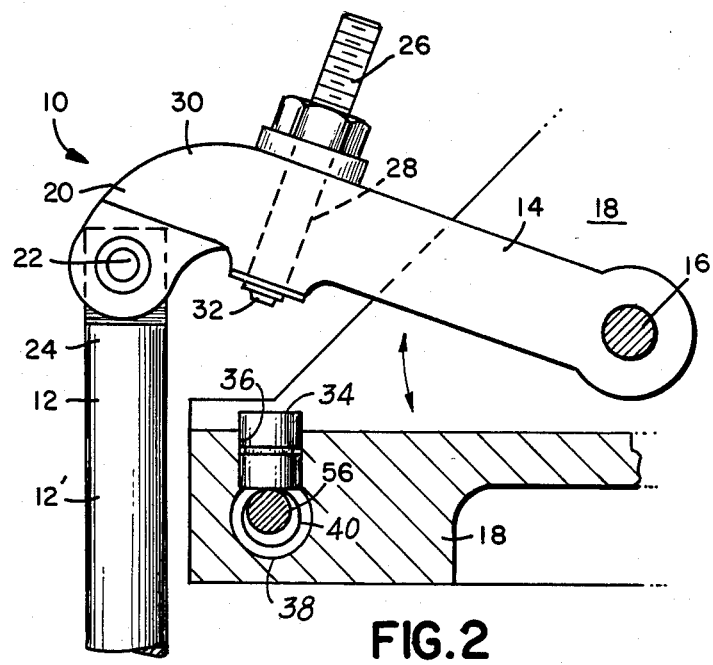
FIG. 2 is a side elevational view of the placement head depth stop control in one position of movement.
Figure 3:
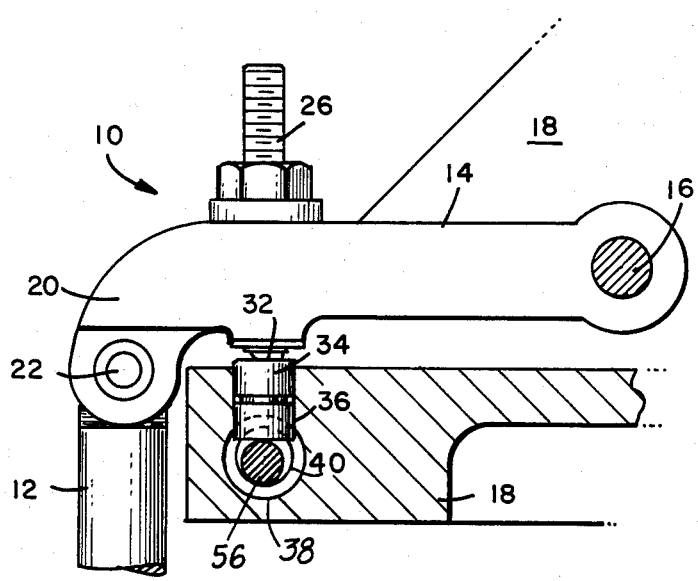
FIG. 3 is a side elevational view of the placement head depth stop control in another position of movement.

An abutment screw stop 26 is threaded at 28 through the central portion 30 of the drive lever 14. The end 32 of the stop 26 is adapted to contact the insert stop 34 slidably disposed in an opening 36 in the support 18. The contact of the end 32 of stop 26 with the insert stop 34 will limit the downward travel of the shaft 12 and thus the spacing between the component inserting means of the placement head and the surface of the printed circuit board. FIGS. 2 and 3 illustrate the actuator 10 in the raised and lowered positions and the insert stop 34 in the raised and lowered positions to show the control of the insert stop 34 over the throw of actuator 10.

The position of insert stop 34 is controlled in the following unique manner as illustrated in FIG. 1. The opening 36 communicates with the transverse opening 38 passing through the support 18. A shaft 40 mounted in bearings 42 extends through the opening 38 and carries a pulley 44 driven by a belt 46 from a drive pulley 48 on a servo motor 50. The motor 50 is carried on the machine frame and has a support flange 52 with a bearing 54 journaled on shaft 40 to aid in supporting the shaft 40.

The shaft 40 has an eccentric cam surface 56 upon which the insert stop 34 rests. The servo motor 50 is operated by the machine computer control to rotate the shaft 40 to properly position the eccentric bearing surface 56 to raise or lower the insert stop 34 to control the throw of actuator 10 for a given component to be inserted to properly space the component inserter of the placement head from the board. A further adjustment of the movement of lever 14 is provided by the threaded screw stop 26 which can be adjusted to raise and lower lever 14 the respect to stop 34.

Attention is now directed to FIG. 1 which illustrates the use of the placement head control on a double headed placement machine. Each of the actuators 10 are identical and are connected to control shafts 12 which position the component inserter of the machine, as previously described. The shafts 40 are interconnected by shaft 58 so that the servo motor 50 will position both stops 34 and thus the throw of both of the shafts 12 in the manner described. A pair of flexible couplings 60 are on the connecting shaft 58 to buffer the drive between the shafts 40.

It can thus be seen that by the unique positioning of the stop 34 by shaft 40 and with the end 32 of stop 26 abutting stop 34, the throw of the component inserting portion of the placement head is accurately controlled to adjust the spacing between the end of the head and the printed circuit board. In this manner, an accurate adjustment for different component diameters is provided during the automatic component insertion operation.

I claim:

1. An electrical component placement head control for varying the spacing between a component inserting mechanism on the head and the surface of a printed circuit board comprising:
   a. an actuator for moving the inserting mechanism toward and away from the board;
   b. means to limit the movement of said actuator and thus the movement of the inserting mechanism toward the board;
   c. said means including a stop positionable toward and away from said actuator; and
   d. said means also including a rotary shaft having an eccentric cam surface that positions said stop upon rotation of said shaft to cause movement of said stop toward and away from said actuator.

2. The electrical component placement head control of claim 1 including an abutment on said actuator adapted to contact said stop to limit the movement of said actuator.

3. The electrical component placement head control of claim 2 wherein said abutment is located medially of said actuator and is adjustably mounted on said actuator to vary the spacing between said actuator and said stop.

4. The electrical component placement head control of claim 1 wherein a shaft drivingly connected to the inserting mechanism is pivotally mounted at one end of said actuator, with said actuator being mounted at the opposite end for rotation to drive said shaft and inserting mechanism toward and away from the board.

5. The electrical component placement head control of claim 1 including a drive means connected to said rotary shaft to vary the position of said eccentric cam surface and thus said stop to control the throw of said actuator for a given component to be inserted.

6. In an electrical component insertion machine having dual placement heads, a mechanism for controlling the spacing between a component insertion mechanism on each head and printed circuit boards comprising:
   a. an actuator on each placement head for moving each insertion mechanism toward and away from the boards;
   b. means on each head for limiting the movement of each of said actuators and thus the movement of the inserting mechanisms toward the board;
   c. said means including an adjustable stop means on each head positionable toward and away from said actuators; and
   d. said means also including a rotary shaft in each head having an eccentric cam surface that positions said stop means toward and away from said actuator.

7. The electrical component insertion machine of claim 6 wherein said rotary shafts of each head are interconnected by a drive shaft.

8. The electrical component insertion machine of claim 7 including a drive means rotating said drive shaft to position each of said rotary shafts.

9. The electrical component insertion machine of claim 8 wherein a flexible coupling means is interposed between said rotary shafts.

* * * * *